United States Patent [19]

Raby

[11] Patent Number: 4,854,986
[45] Date of Patent: Aug. 8, 1989

[54] BONDING TECHNIQUE TO JOIN TWO OR MORE SILICON WAFERS

[75] Inventor: Joseph S. Raby, W. Melbourne, Fla.

[73] Assignee: Harris Corporation, Melbourne, Fla.

[21] Appl. No.: 49,637

[22] Filed: May 13, 1987

[51] Int. Cl.$^4$ ............................................. B32B 31/14
[52] U.S. Cl. ........................................ 156/87; 156/89;
165/80.1; 165/80.2; 165/80.3; 165/146;
165/185
[58] Field of Search ............. 156/87, 89, 583.4, 583.9;
165/80.1, 80.2, 80.3, 146, 185; 174/16 HS;
357/81; 148/33; 437/247, 248, 250

[56] References Cited

U.S. PATENT DOCUMENTS

| | | |
|---|---|---|
| 2,698,273 | 12/1954 | Miner et al. ...................... 156/583.9 |
| 2,893,904 | 7/1959 | Dickson .............................. 165/185 |
| 2,935,666 | 5/1960 | Namen ................................ 165/185 |
| 3,101,114 | 8/1963 | Katz .................................... 165/185 |
| 3,249,680 | 5/1966 | Sheets et al. ........................ 165/185 |
| 3,386,503 | 6/1968 | Corning et al. ................... 156/583.4 |
| 3,823,351 | 7/1974 | Chambers .......................... 165/80.3 |
| 3,982,992 | 9/1976 | Moffitt .............................. 156/583.4 |
| 4,626,206 | 12/1986 | McIntosh ........................... 165/185 |
| 4,649,990 | 3/1987 | Kurihara et al. ..................... 165/185 |
| 4,682,269 | 7/1987 | Pitasi .................................. 165/185 |

Primary Examiner—Caleb Weston
Attorney, Agent, or Firm—William A. Troner; Charles C. Krawczyk

[57] ABSTRACT

A method of manufacturing semiconductors formed of bonded wafers. The method includes the use of a heat sink. The heat sink induces a temperature gradient to occur on a single area at the interface of the wafers with the gradient moving rapidly across the remaining surface. As a result of the temperature front, the voids or uncontacted areas between the wafers which result in a typical bonding process are substantially reduced, thereby providing a stronger and more effective bond.

15 Claims, 2 Drawing Sheets

4,854,986

BONDING TECHNIQUE TO JOIN TWO OR MORE SILICON WAFERS

FIELD OF THE INVENTION

The present invention relates generally to the manufacture semiconductor wafers, and more particularly to the method of fabricating a bonded semiconductor structure.

BACKGROUND OF THE INVENTION

In the present era of very large scale integration (VLSI) in which dimensions of transistor and other semiconductor structures are being reduced to less than one micrometer, isolation between devices has become very significant. One method of achieving the quality isolation needed for producing VLSI semiconductors is by using bonded wafer technology. By providing a thin layer of insulation between the semiconductor wafers, better isolation can be obtained for the devices formed in the semiconductor material, resulting in increasing speed, decreasing power dissipation, and improving transient radiation hardness of the semiconductor devices.

Although there are many variations and techniques for bonding wafers, the present methods have not been able to provide consistent and uniform results in obtaining a complete bonding of the wafers. For specific applications of bonding such as with silicon on insulator structures (SOI), this incomplete bonding can have significant adverse effects on the SOI devices produced from the bonding process.

The inventor has discovered that the prior art procedures used for bonding wafers are a significant cause of the inconsistency in bonding of the wafers. In the standard procedure, a pair of wafers are arranged contiguously together and placed upright in a standard quartz container, referred to as a boat. The boat and wafers are then placed in a furnace for about three to four hours at a temperature of approximately 1050° C.

It is known that as the wafers are being heated, excess gases and water molecules are formed at the interface of the wafers. As these gases and water molecules accumulate at this interface, they will form voids in between the wafers unless the gases and water molecules are allowed to escape from between the wafers. The present procedures of bonding wafers in a standard boat does not allow for these excess gases and water molecules to effectively escape, thus inducing the voids to occur.

It is believed that the gases and water molecules are prevented from escaping because the standard boat container used in the bonding process provides several distinct heat sinking points along the circumference of the combined wafers. These heat sinking points will create intermittent cool spots on the circumference thereby further creating intermittent areas of nonheat sink locations. It is in these latter areas where the actual bonding of the wafers begins. It is the plurality of beginning bonding areas which inhibit the accumulated gases and water molecules from escaping from between the wafers. This results in trapping these gases and water molecules in between the wafers which leads to incomplete bonding. Because the number of beginning bonding areas varies due to the dependence of the placement of the wafers in the boat, the number of voids for each bonded wafer will also vary thereby providing the basis for inconsistent bonding results.

SUMMARY OF THE INVENTION

It is thus an object of the present invention to provide a new and improved method for bonding wafers.

It is another object of the present invention to provide a new and improved means for reducing the voids at the interface between the wafers.

It is further an object of the present invention to provide a new and improved bonded wafer having consistently complete bonds between the wafers.

It is still another object of the present invention to provide a new and improved silicon on insulator semiconductor.

The inventor has discovered that by inducing a temperature gradient at a selected area of the interface during the bonding of the wafers, the voids between the wafers are substantially reduced resulting in a more consistently uniform and complete bond. In lieu of this discovery, the inventor, in accordance with a preferred embodiment, has designed heat sinking plates which are placed on the surfaces of the prebonded wafers in such a manner so as to induce an instantaneous temperature gradient across the bonding surfaces when heat is applied. This temperature gradient is designed to originate at a preselected area and rapidly progress across the remaining surface.

Because a temperature gradient is induced during the bonding process, fewer voids consistently occur as a result of the temperature front "pushing" out the excess gases and absorbed water molecules from between the wafers. The absence of voids at the interface leads to a stronger and more complete bond between the wafers.

In accordance with a preferred practice of the invention, the heat sink plates are formed such that they cover the outer circumference of the outer wafer surfaces, leaving the central area of the noncontiguous wafer surfaces uncovered. In this way, the center area begins bonding first with a temperature gradient moving radially outward toward the circumference of the combined wafers.

In accordance with another feature of the present invention, the wafers are preheated at approximately 180° C. for approximately two or three hours prior to heating the wafers at the higher bonding temperature. The inventor has discovered that the preheating drives out some of the excess gases which would otherwise add to the accumulated gases needed to be "pushed" out by the thermal gradient.

Further, objects, advantages, and novel features of the present invention will become more apparent from the following description when taken with the accompanying drawings which show, for purposes of illustration only, embodiments in accordance with the present invention.

BRIEF DESCRIPTIONS OF THE DRAWINGS

DETAILED DESCRIPTION OF THE DRAWINGS

Figure 1:
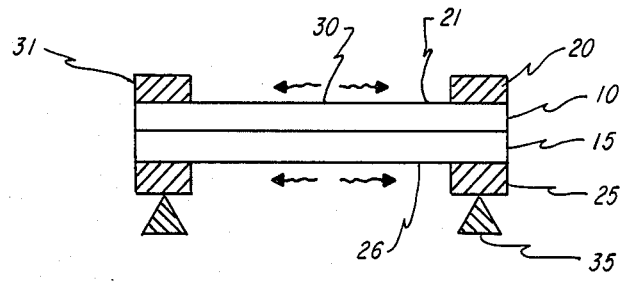
FIG. 1 is a side view of a preferred embodiment of the invention.
Figure 2:
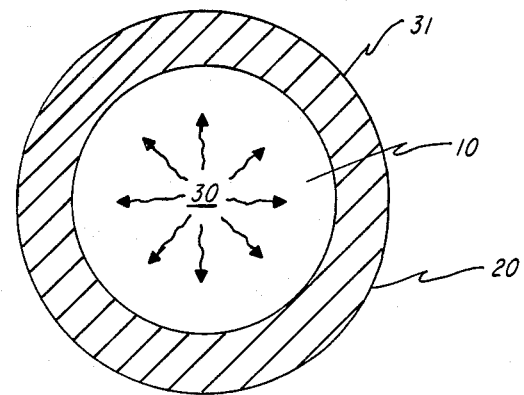
FIG. 2 is a top view of the embodiment in FIG. 1.

Referring to FIGS. 1 and 2, a pair of wafers 10 and 15 are arranged together in contact with each other. The wafers 10 and 15 may comprise any semiconductor material such as silicon having for example a resistivity of 3-5 ohm-cm if doped with N-type material or 8-15 ohm-cm if doped with P-type material. Prior to arranging the wafers together, the surfaces of the wafer are cleaned with a cleansing agent such as hydrofluoric (HF) acid. This will remove any surface contaminants prior to placing the wafer inner surfaces contiguously together. A native oxide of 10-20 Angstroms will generally grow on the respective exposed inner and outer surfaces of the wafers immediately after cleaning with the HF solution.

A pair of circular disks or plates 20 and 25 are placed respectively on the outer surfaces 21 and 26 of the two wafers 10 and 15 to be bonded. These plates 20 and 25 each have a thickness of approximately the thickness of each wafer 10 and 15. The circular plates 20 and 25 each have an opening at its center having a radius of approximately half the radius of the respective wafer itself. This provides a heat sink around the outer surface of the wafer structure while exposing the center 30, such that when heat is applied to the wafers 20 and 25, the center 30 of the wafers will lead the rest of the structure thermally, thereby setting up an instantaneous thermal gradient from the center 30 of the wafer to its edge 31. The opening may vary in radius as long as it is made large enough to permit an effective temperature gradient to occur.

The heat sink plates 20 and 25 are made of a high temperature refractory material such as quartz or silicon for the purpose of providing a heat sink about the circumference of the combined wafers. The lower plate 25 can further include leg extensions 35 for providing support to the heat sink plates 20 and 25 and wafers 10 and 15.

The bonding process includes placing the respective heat sink plates 20 and 25 and the wafers 10 and 15 in a heat producing means such as a furnace for approximately two hours at a temperature between approximately 800° C. and approximately 1200° C. Alternatively, the heat sink plates 20 and 25 and wafers 10 and 15 may be placed in a rapid thermal annealer (RTA) such as the Heat Pulse 210 manufactured by A.G. Assoc., as indicated in commonly owned co-pending application, Ser. No. 042,135, and incorporated herein by reference. When heat is applied to the wafers, the heat sink plates 20 and 25 induce a temperature gradient to originate in a central area 30 of the wafers with the temperature gradient progressing radially along a continuous front to the outer circumference 31 of the wafers 10 and 15. The heat sink plates 20 and 25 are formed to have a sufficiently low mass so as to allow the thermal gradient to progress and dissipate rapidly on the order of a few seconds or less. The inventor has determined that the rapid progression and dissipation of the temperature gradient provides for the best results in the bonding of the two wafers. After the wafers 20 and 25 are bonded together, active devices may be implanted or diffused in the upper 10 and/or lower 15 wafers using known methods.

Figure 3:
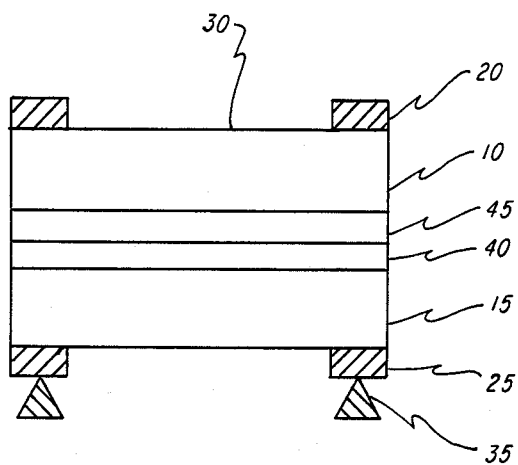
FIG. 3 is a side view of another preferred embodiment of the invention.

FIG. 3 shows a preferred practice of the invention showing an SOI device formed by bonding. In this process, a substrate 15 is formed of a low resistivity monocrystalline silicon wafer of N-type conductivity. An epitaxial layer 40 of monocrystalline silicon is grown by know methods such as be deposition. A handle wafer 10 of silicon or any other material having at least the same coefficient of thermal expansion as the substrate 15 is provided as the second wafer. An oxide layer 45 is provided on a first surface of the handle wafer 10 and may comprise a thermal oxide or an oxide formed by vapor deposition. A second layer of insulation may be formed on the exposed surface of the epitaxial layer. The upper heat sink plate 20 is placed on the exposed surface of the handle wafer 10, while the lower heat sink plate 25 is placed on the exposed surface of the substrate 15. The wafers 10 and 15, and heat sink plates 20 and 25 are then placed in a furnace or RTA where a thermal gradient will result when the wafers are heated.

The inventor has also discovered that an improved bonding results between the wafers 10 and 15 if, prior to placing the wafer and the respective heat sink plates 20 and 25 in a high temperature environment (e.g., furnace or RTA), the pre-bonded wafers are preheated at a low temperature, at approximately 180° C. for a two to three hour period. This preheating may be performed in a furnace with or without the heat sink plates. It has been determined that the preheating drives out some of the excess gases trapped between the wafers, resulting in minimizing the gases which would otherwise add to the accumulated gases and water molecules needed to be pushed out by the thermal gradient. This additional step has been observed as further improving the overall bond.

Although the present invention has been described and illustrated in detail, it is to be clearly understood that the same is by way of illustration and example only, and is not to be taken by way of limitation. The spirit and scope of the present invention are to be limited only by the terms of the appended claims.

I claim:

1. A method of bonding wafers comprising the steps of:
    (a) providing a first wafer having an exposed first surface;
    (b) providing a second wafer having an exposed first surface;
    (c) engaging said first and second wafers in a heat producing means, wherein said first surfaces of said first and second wafers are arranged contiguously; and
    (d) bonding said first and second wafers by inducing a temperature gradient on said first surfaces of said first and second wafers, wherein said gradient originates at a predetermined point on said first surfaces of said wafers and radiates outwardly along a continuous front across the remaining area of said first surfaces of said first and second wafers.

2. The method of claim 1, further comprising the step of dissipating said thermal gradient on said wafer surfaces rapidly after said temperature gradient originates.

3. The method of claim 2, wherein the inducement of a temperature gradient includes the step of selectively arranging a heat sink means on a second surface of said first and second wafers for providing a heat sink on selective areas of said second surfaces for purposes of inducing a thermal gradient.

4. The method of claim 3, wherein said heat sink means includes a circular means having an aperture at its center, wherein said temperature gradient is induced to originate centrally on the surfaces of said wafers and to radiate radially to the outward circumference of said surfaces.

5. The method of claim 3, wherein said heat sink means includes a supporting means for supporting said wafers, said supporting means being arranged contiguous with a portion of a said second surface of said first wafer.

6. The method of claim 3, wherein said heat producing means includes a rapid thermal annealer (RTA), said method of bonding wafers further comprising heating said wafers at a temperature between approximately 800° C. to 1200° C. for approximately three to ten minutes.

7. The method of claim 6, further comprising the steps of preheating the combined wafers at a temperature of approximately 180° C. for approximately two hours prior to heating said wafers between approximately 800° C. and approximately 1200° C.

8. A method of bonding wafers comprising the steps of:
   (a) arranging a first surface of a first wafer and a first surface of a second wafer into contact with each other;
   (b) selectively providing a heat sink means for inducing a heat sink on selective areas of said first and second wafers; and,
   (c) placing said first and second wafers and said heat sink means in a heat producing means, wherein said heat sink means includes a heat sinking material which induces a thermal gradient to result on said surfaces of said wafers when said wafers are exposed to heat generated by said heat producing means.

9. The method of claim 8, wherein said heat sink means is of a sufficiently low mass for allowing said thermal gradient to dissipate rapidly.

10. The method of claim 9, wherein said heat sink means includes a first and second circular plate having an aperture at the center of each plate, wherein said first plate is arranged on a second surface of said first wafer and said second plate is arranged on a second surface of said second wafer, wherein said temperature gradient originates at the center of said wafers and radially progresses along a continuous front.

11. The method of claim 9, wherein said heat sink means includes a supporting means which extends partially under a portion of said first wafer, said supporting means being arranged contiguous with a portion of said second surface of said first wafer.

12. The method of claim 9, wherein said heat producing means includes a rapid thermal annealer (RTA).

13. A method of manufacturing a silicon on insulator semiconductor including the steps of:
   (a) providing a first layer of semiconductor material formed on a first surface of a support structure;
   (b) providing a first layer of insulative material on a first surface of a handle wafer, said first layer of said insulative material having an exposed surface;
   (c) arranging an exposed surface of said first layer of semiconductor material into contact with said exposed surface of said first layer of said insulative material;
   (d) selectively arranging a first heat sink plate on a second surface of said support structure and a second heat sink plate on a second surface of said handle wafer, wherein said first and second heat sink plates have the same circumference of said support structures and said handle wafers, and further having an aperture formed at the center of each plate for selectively exposing said second surfaces of the respective support structure and handle wafer; and,
   (e) placing said first and second heat sink plates and said support structure and handle wafer in a means for producing heat and heating the same, wherein a temperature gradient is induced on said surfaces of said first and second layers, said surfaces becoming bonded as said temperature gradient originates centrally on the said surfaces and radially progresses toward the outer perimeter of said surfaces.

14. The method of claim 13, wherein said heat producing means includes a rapid thermal annealer (RTA), said bonding includes heating of said semiconductor material and insulative material between 800° C. to 1200° C. for about three to ten minutes.

15. A method of bonding semiconductor wafers comprising:
   (a) arranging a first wafer and a second wafer contiguously with each other;
   (b) preheating said wafers at a temperature of approximately 180° C. for approximately less than three hours;
   (c) bonding said first and second wafers together by providing a circular heat sink ring on an exposed surface of the respective wafers and heating said wafers to between approximately 800° C. and approximately 1200° C.

* * * * *